(12) United States Patent
Oka (10) Patent No.: US 6,433,352 B1
(45) Date of Patent: Aug. 13, 2002

(54) METHOD OF POSITIONING SEMICONDUCTOR WAFER

(75) Inventor: Nobuhiko Oka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/465,014

(22) Filed: Dec. 16, 1999

(30) Foreign Application Priority Data

Dec. 17, 1998 (JP) .............................................. 10-358772

(51) Int. Cl.⁷ ................................................ G01N 21/84
(52) U.S. Cl. ..................................... 250/559.3; 356/401
(58) Field of Search ....................... 250/559.3; 356/400, 356/401

(56) References Cited

U.S. PATENT DOCUMENTS 5,502,311 A * 3/1996 Imai et al. ................... 250/548
5,525,808 A * 6/1996 Irie et al. ..................... 250/548
5,710,620 A * 1/1998 Taniguchi ..................... 355/53
5,793,473 A * 8/1998 Koyama et al. ............... 355/55

FOREIGN PATENT DOCUMENTS

JP          6-224103          8/1994

* cited by examiner

Primary Examiner—Janice L. Krizek
(74) Attorney, Agent, or Firm—Nixon & Vanderhye P.C.

(57) ABSTRACT

A method of positioning a semiconductor wafer includes the steps of fixing a semiconductor wafer on a wafer stage, the semiconductor wafer including a plurality of shot areas regularly arranged thereon, and positioning each of the shot areas in turn to an exposure position by a step and repeat system, wherein a step pitch to move each of the shot areas to the exposure position is adjusted by a magnitude of warpage of the semiconductor wafer.

7 Claims, 7 Drawing Sheets

METHOD OF POSITIONING SEMICONDUCTOR WAFER

CROSS-REFERENCE TO RELATED APPLICATION

This application is related to Japanese application No. Hei 10(1998)-358772 filed on Dec. 17, 1998, whose priority is claimed under 35 USC §119, the disclosure of which is incorporated by reference in its entirety.

BACKGROUND OF THE INVENTION

1. Field of the Invention

The present invention relates to a method of positioning a semiconductor wafer, and particularly to a method of positioning each of a plurality of shot areas to an exposure position in turn by a step and repeat system, when the plurality of shot areas are regularly arranged on the wafer and a circuit pattern is exposed in each shot area.

2. Description of the Related Art

Semiconductor devices such as ICs or LSIs have been made more and more minute and dense. When exposing a circuit pattern formed on a photomask or a reticle in multiple shot areas on a semiconductor wafer one by one with an exposure equipment, it is desired to position each shot area to an exposure position of the exposure equipment with high accuracy.

For the exposure equipment, a step and repeat system is often used, in which a semiconductor wafer fixed on a wafer stage is positioned to an exposure position for each shot area to be exposed through a circuit pattern. With the exposure equipment using the step and repeat system, each shot area is positioned to the exposure position while a semiconductor wafer is positioned on the wafer stage, as disclosed in Japanese Unexamined Patent Publication No. Hei 6(1994)-224103, for example. The semiconductor wafer is positioned with respect to the wafer stage based on alignment marks provided on each semiconductor wafer.

Figure 10A:
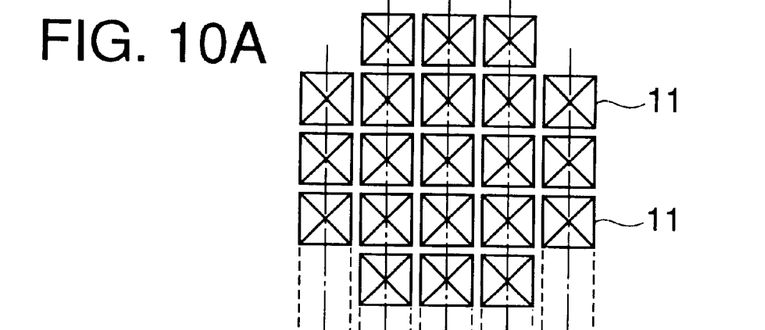
FIG. 10A is a top view of shot areas on a semiconductor wafer without warpage.
Figure 10B:
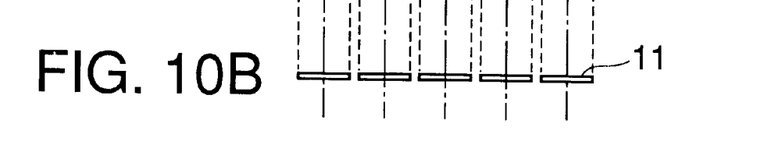
FIG. 10B is a side view of FIG. 10A.
Figure 11A:
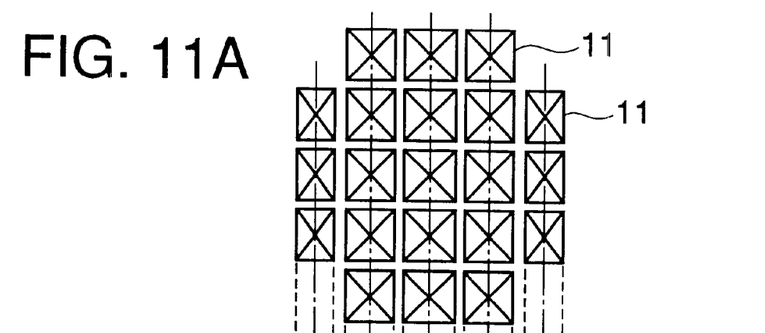
FIG. 11A is a top view of shot areas on a warped semiconductor wafer.
Figure 11B:
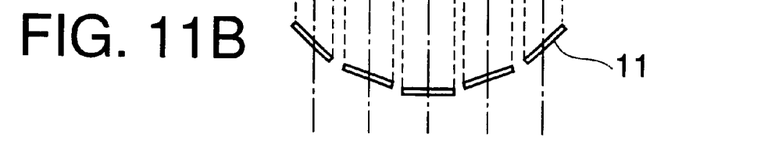
FIG. 11B is a side view of FIG. 11A.

As shown in FIG. 10A and FIG. 10B, shot areas 11 on a semiconductor wafer are usually lined up crosswise at even intervals. Accordingly, with the exposure equipment using the step and repeat system, the wafer stage on which the semiconductor wafer is fixed is moved in order with a specified step pitch to position each shot area 11 to the exposure position in turn. However, when the semiconductor wafer itself is warped as shown in FIG. 11A and FIG. 10B, each of the actual step pitches becomes smaller than the specified step pitch, even more so for a position closer to the rim of the semiconductor wafer.

In addition, the position of an alignment mark to be detected on the warped semiconductor wafer is radially or circumferencially displaced with respect to the position of an alignment mark on an unwarped wafer, which causes inaccurate positioning of the shot center in each shot area 11.

Conventionally, to solve this problem, each shot area 11 is positioned and adjusted precisely to the exposure position every time each shot area 11 is stepped to the exposure position. However, positioning and adjusting each shot area 11 precisely to the exposure position causes a problem of significantly reduced throughput.

SUMMARY OF THE INVENTION

The present invention solves the problems mentioned above. It is an object of the present invention to provide a method of positioning a semiconductor wafer that allows high-accuracy positioning of each shot area to the exposure position without reducing the throughput even if the semiconductor wafer is warped.

Accordingly, the present invention provides a method of positioning a semiconductor wafer by a step and repeat system comprising the steps of fixing a semiconductor wafer on a wafer stage, the semiconductor wafer including a plurality of shot areas regularly arranged thereon, and positioning each of the shot areas in turn to an exposure position by the step and repeat system, wherein a step pitch to move each of the shot areas to the exposure position is adjusted by a magnitude of warpage of the semiconductor wafer.

PREFERRED EMBODIMENT OF THE INVENTION

The semiconductor wafer used in the present invention is, for example, a single crystalline wafer having a thickness of 500 to 700 $\mu$m and a diameter of 4 to 6 inches. The surface thereof is mirror-finished and a photosensitive photoresist film is formed thereon so that the semiconductor wafer may be treated by photolithography. On one semiconductor wafer a plurality of semiconductor (LSI) chips are formed. One shot area signifies an exposed region corresponds to one chip.

In an exposure equipment applied to the present invention, an image of a circuit pattern provided on a photomask, i.e., reticle is projected on an exposure position through a lens system such that one shot area on the exposure position is exposed. The semiconductor wafer is fixed on a wafer stage capable of moving in the two-dimensional direction (the direction of X-Y). The wafer stage is moved repeatedly in step only by a predetermined step pitch towards the directions of X and Y so that each shot area to be exposed is positioned in turn to the exposure position, thereby exposing a plurality of shot areas. Such a system in which the movement in step is repeated is referred to as "a step and repeat system".

In general, as the circuit formation process progresses, the semiconductor wafer generates warpage in a spherical shape due to stress by an oxide film formed on the wafer surface or plastic deformation through heat treatment. The magnitude of warpage becomes more than several tens of $\mu$m in the case of 6 inch wafer. In the present invention, an error in step pitch caused by the warpage is effectively corrected based on the magnitude of warpage.

The magnitude of warpage of the semiconductor wafer can be determined with respect to an alignment mark, the alignment mark being provided for each shot area on the semiconductor wafer to position each shot area on the wafer stage.

That is, in the present invention, the magnitude of warpage is measured, for example, from a difference in height between a central portion and a peripheral portion of the semiconductor wafer. Using the measured value the magnitude of warpage is calculated with respect to the alignment mark provided for each shot area. Then, a central position of each shot area, i.e., a shot center is calculated by the magnitude of warpage at each alignment mark, determining a correction value of the step pitch corresponding to each shot area based on the calculated value. Therefore, each correction value of step pitches for the whole shot areas is determined by merely measuring a magnitude of warpage at one point of the wafer, without significant deterioration in the efficiency of the exposure process. Alternatively, the determination of the magnitude of warpage can be conducted by using one or a plurality of well known focus sensors.

The magnitude of warpage of the semiconductor wafer should preferably be measured after the semiconductor wafer is positioned on the wafer stage.

Thus a coordinates system on the semiconductor wafer is defined corresponding to that of the wafer stage and the relationship between the magnitude of warpage and the coordinates can be readily specified.

Figure 1:
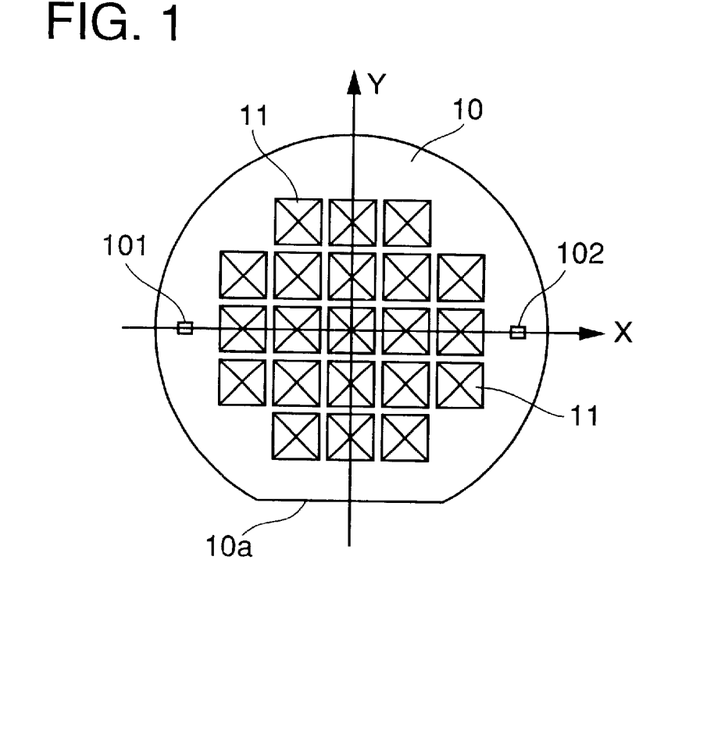
FIG. 1 is a top view of a semiconductor wafer with shot areas used in the present invention.

In the exposure equipment using the step and repeat system, in which, as shown in FIG. 1, a semiconductor wafer (hereafter wafer) 10 including on its surface multiple shot areas 11 with a first circuit pattern formed thereon is positioned and fixed, each shot area 11 being positioned in turn to the exposure position, an image of a circuit pattern provided on a reticle being exposed in each of the positioned shot areas 11, the method of the present invention is used to position each shot area 11 on the wafer 10 to the exposure position.

The shot areas 11 provided on the wafer 10 are lined up with regularity in matrix-like array along the X- and Y-axes of the wafer 10. On the wafer 10, global alignment marks 101 and 102 for positioning the wafer 10 itself and alignment marks (not shown) for positioning each shot area 11 are provided. Each of the alignment marks is marked in the middle of each boundary between two shot areas 11 adjacent in the X and Y direction.

Figure 12:
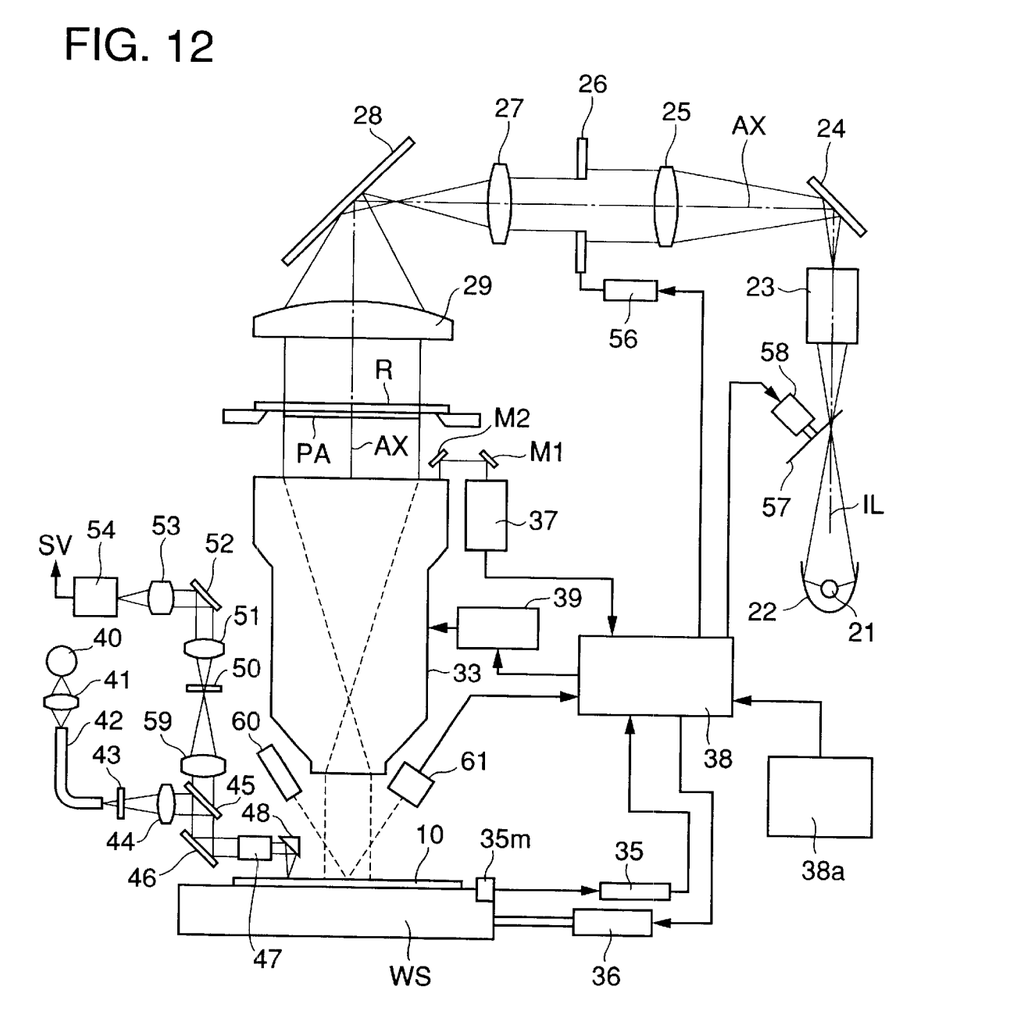
FIG. 12 is an explanatory drawing of a configuration of an exposure equipment to which the positioning method of the present invention is applied.

FIG. 12 shows a schematic configuration of exposure equipment to which the positioning method of the present invention is preferably applied. In FIG. 12, illuminating light IL emitted from a mercury lamp 21 is reflected on an oval mirror 22, converged at its secondary focus once and then strikes into a lighting optical system 23. In the vicinity of the secondary focus of the oval mirror 22, a shutter 57 driven by a motor 58, which opens and closes the light path of the illuminating light IL, is located.

In FIG. 12, the illuminating light IL out of the lighting optical system 23 is mostly reflected on a beam splitter 24 and reaches a mirror 28 through a lens 25, a variable field stop (reticle blind) 26 and a lens 27. The illuminating light IL reflected almost vertically downward from the mirror 28 illuminates with nearly uniform illuminance a pattern area PA on a reticle R through a main condenser 29. The arrangement surface on the reticle blind 26 is conjugate (concerning image formation) with the pattern-forming surface of the reticle R. Changing the size and shape of the opening by opening/closing the multiple movable blades that constitute the reticle blind 26 with a drive system 56 allows setting of the illuminated field of the reticle R at will.

The illuminating light IL through the pattern area PA of the reticle R strikes into a projection optical system 33 and a projected image of a circuit pattern on the reticle R, which is reduced to ⅕ with the projection optical system 33, is laid to form a image on a shot area of the wafer 10 with a resist layer formed thereon, which is held so that its surface roughly coincides with the optimum-image-forming surface of the projection optical system 33.

The wafer 10 is sucked with vacuum by a minutely rotatable wafer holder (not shown) and held on the wafer stage WS by means of this wafer holder. The wafer stage WS is configured to allow two-dimensional movement in step and repeat system with a motor 36. When transferring exposure of the reticle R to a shot area on the wafer 10 is finished, the wafer stage WS is moved to the next shot position. A movable mirror 35m is fixed on the edge of the wafer stage WS that reflects the laser beam from a laser interferometer 35 and the two-dimensional coordinates of the wafer stage WS are constantly detected by the laser interferometer 35 with a resolution of approximately 0.01 $\mu$m, for example. The laser interferometer 35 detects coordinates in the direction perpendicular to the optical axis AX of the projection optical system 33 of the wafer stage WS (x direction) and in the direction perpendicular to this (y direction). The coordinates in x and y directions determines the stage coordinate system (rest frame) (x, y) of the wafer stage WS. That is, the coordinates of the wafer stage WS measured by the laser interferometer 35 is the coordinates on the stage coordinate system (x, y).

An alignment sensor using off-axis system (hereafter FIA system sensor) is provided beside the projection optical system 33. This FIA system leads the light generated by a halogen lamp 40 to an interference filter 43 through a condenser 41 and optical fiber 42, which cuts the light of the wave range to which the resist layer is sensitive and of the infrared wave range. The light through the interference filter 43 strikes into an objective lens 47 through a lens system 44, beam splitter 45 and mirror 46. The light out of the objective lens 47 is reflected on a prism (or a mirror) 48 at the bottom of the lens-barrel of the projection optical system 33 in such a manner that does not block the illuminated field of the projection optical system 33 and irradiates the wafer 10 in a nearly vertical direction.

The light out of the objective lens 47 is radiated on an area including an alignment mark on the wafer 10 and the light reflected on the area is led to a index plate 50 through the prism 48, objective lens 47, mirror 46, beam splitter 45 and lens 59. The index plate 50 is located on the surface conjugate with the wafer 10 with reference to the objective lens 47 and lens 59 and the image of an alignment mark on the wafer 10 is formed in the transparent window of the index plate 50. In addition, the index plate 50 includes two linear marks extending in the Y direction arranged at a specific interval in the X direction formed in the transparent window as an index. The light through the index plate 50 is led to a set of image sensors (such as a CCD camera) 54 through a lens 51, mirror 52 and lens 53 and the images of the alignment mark and the index are formed on the light-receiving surface of the set of image sensors 54. The image signals SV out of the set of image sensors 54 are fed to the main controller 38, which calculates the position in the x direction (coordinate) of the alignment mark. In addition to the set of sensors of the FIA system (FIA system for the x-axis) of the above configuration, another set of sensors of the FIA system (FIA system for the y-axis) is provided, which is not shown in FIG. 12.

To an upper side of the projection optical system 33, an alignment sensor using TTL (through-the-lens) system 37 is provided as well and the light for position detection, which is out of the alignment sensor 37, is led to the projection optical system 33 through mirrors M1 and M2. The light for position detection is radiated on an alignment mark on the wafer 10 through the projection optical system 33 and the light reflected on the alignment mark is returned to the alignment sensor 37 through the projection optical system 33 and mirrors M2 and M1. The alignment sensor 37 determines the position of the alignment mark on the wafer 10 using the signal obtained by photoelectrically converting the reflected light that is returned.

Above the wafer stage WS, a laser beam source 60 and a set of light-receiving elements (such as CCDS) 61 are provided. The laser beam emitted from the laser beam source 60 is reflected on a wafer W and the reflected beam strikes into the receiving surface of the set of light-receiving elements 61. The main controller 38 can detect the height of the surface of the wafer W from the incident position of the laser beam with reference to the light-receiving surface, which is used to adjust the focus to the wafer W of the projection optical system 33 or detect the magnitude of warpage in the wafer W.

The main controller 38 comprises a personal computer including a CPU, ROM or RAM, for example, which allows presetting of various conditions such as the size of the wafer 10, number of shot areas, designed coordinates on the stage of the shot areas or exposure time with an input device (such as a keyboard or disk drive) 38a attached.

In the method of the present invention, a pre-alignment device using off-axis system (not shown) roughly orients (pre-aligns) a wafer 10 so that the orientation flat 10a (FIG. 1) of the wafer 10 runs parallel to the direction of the x-axis on the wafer stage WS.

When the wafer 10 is pre-aligned based on the orientation flat 10a, the wafer 10 is loaded on the wafer stage WS of the exposure equipment (FIG. 12) from the pre-alignment device so that the orientation flat 10a runs parallel to the direction of the x-axis of the wafer stage WS. After the focus of the projection optical system 33 is adjusted, the wafer 10 is positioned on the wafer stage WS based on the global alignment marks 101 and 102. The wafer 10 is oriented, with its center coincided with the center of the wafer stage WS, so that the X and Y directions of the wafer 10 parallel the x and y directions of the wafer stage WS respectively.

When the orientation is completed, the main controller 38 detects a representative alignment mark on the wafer 10 with the FIA system sensor and TTL system sensor, based on which the wafer 10 scaling correction value, orthogonality correction value for each shot area 11 on the wafer 10, wafer 10 rotation correction value, offset correction value in the directions of X- and Y-axes of the wafer 10, scaling correction value of each shot area 11 on the wafer 10 and rotation correction value of each shot area 11 are determined to correct the designed values that are preset.

Figure 2:
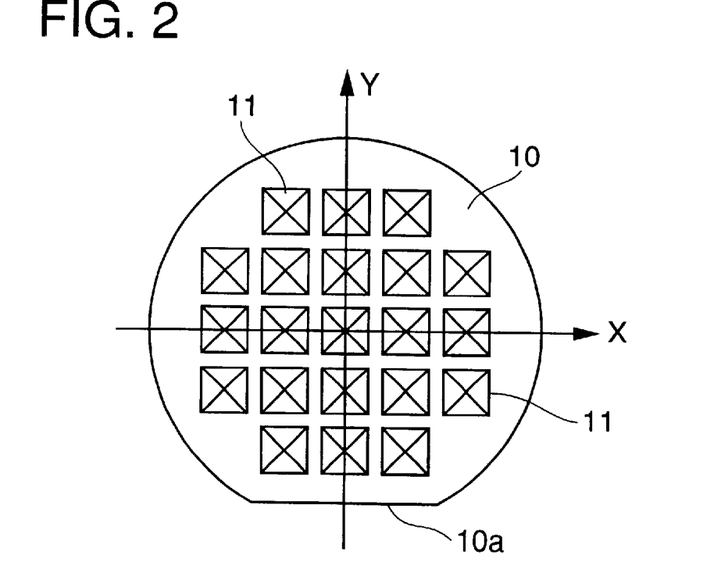
FIG. 2 is an explanatory drawing of a scaling correction value for a semiconductor wafer of the present invention.

The scaling correction value of the wafer 10 is determined to correct the displacement when each shot area 11 is displaced in the X and Y directions of the semiconductor wafer 10 because of overall expansion and/or contraction of the wafer 10 in processing the wafer 10. For example, when the wafer 10 is expanded in the X and Y directions and the spaces between shot areas 11 are increased as shown in FIG. 2, a scaling correction value is calculated to adjust the step pitch so that it corresponds to the spaces between the shot areas 11.

Figure 3:
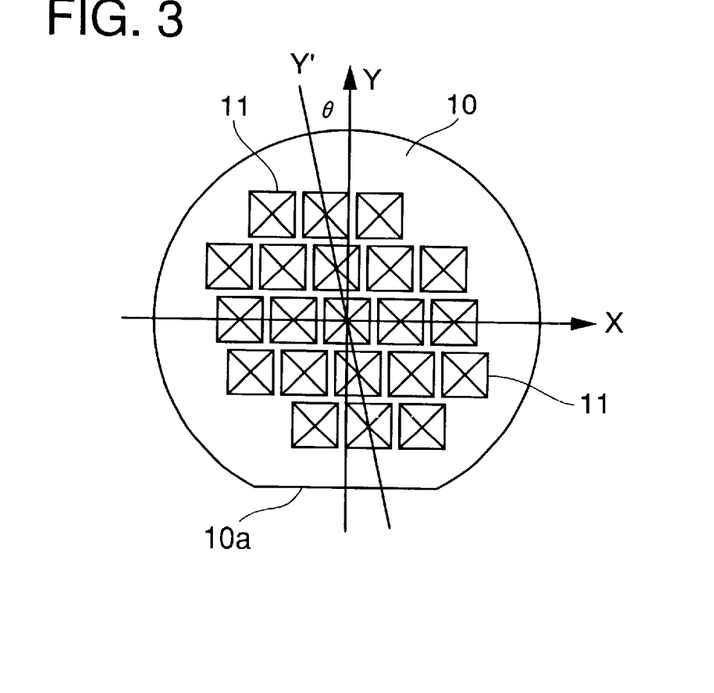
FIG. 3 is an explanatory drawing of an orthogonality correction value for shot areas on a semiconductor wafer of the present invention.

When the shot areas 11 are lined up along the Y'-axis deviated from the Y-axis of the wafer 10 by an angle θ as shown in FIG. 3, for example, the orthogonality correction value of each shot area 11 of the wafer 10 is determined based on the angle θ to correct the deviation.

Figure 4:
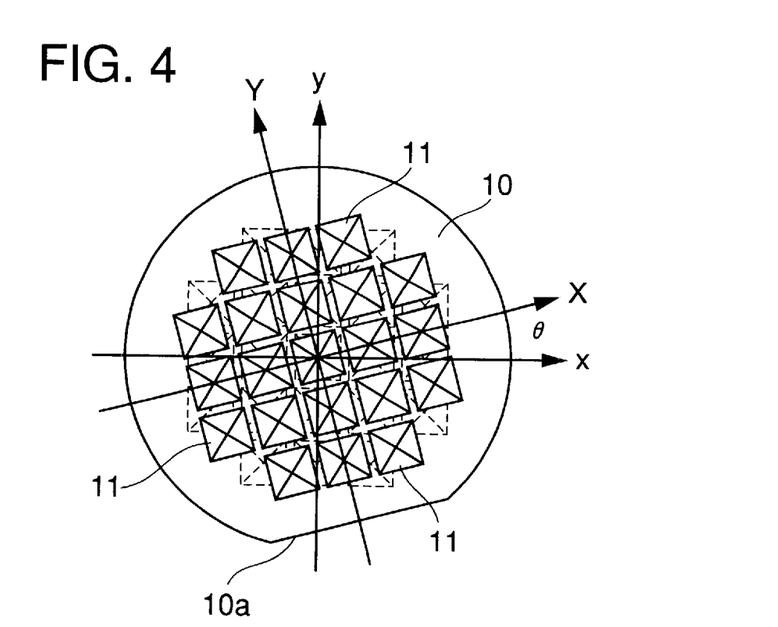
FIG. 4 is an explanatory drawing of a rotation correction value for a semiconductor wafer of the present invention.

When the X- and Y-axes of the semiconductor wafer 10 are rotated from the x- and y axes of the wafer stage respectively by an angle θ as shown in FIG. 4, the rotation correction value of the wafer 10 is determined based on the angle θ to correct the rotation.

Figure 5:
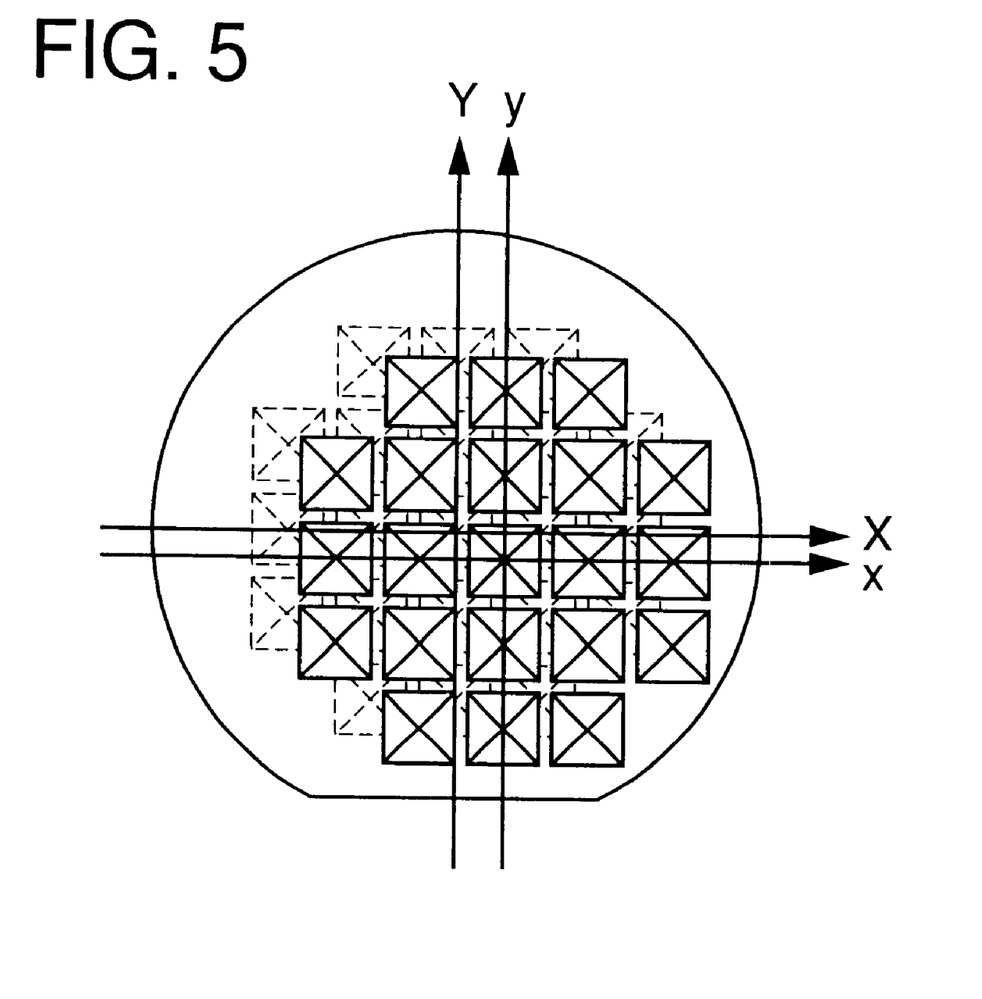
FIG. 5 is an explanatory drawing of an offset correction value for a semiconductor wafer of the present invention.

When the X- and Y-axes of the semiconductor wafer 10 are deviated from the x- and y axes of the wafer stage in the x and y directions respectively as shown in FIG. 5, the offset correction value of the wafer 10 is determined based on the deviation of the wafer 10 from the wafer stage in x and y directions to correct the deviation in each direction.

Figure 6A:
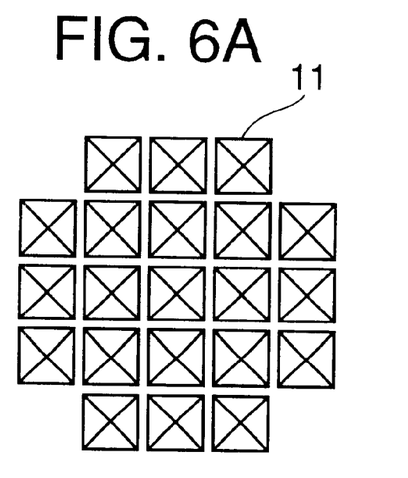
FIG. 6A is an explanatory drawing of a scaling correction value for shot areas on a semiconductor wafer of the present invention.
Figure 6B:
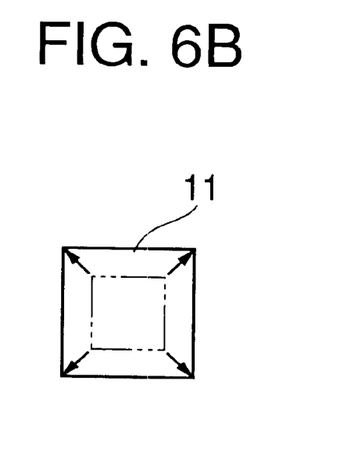
FIG. 6B is a macrograph of a shot area in FIG. 6A.

The scaling correction value of each shot area 11 on the wafer 10 is calculated by measuring the magnitude of expansion/contraction of the shot area itself. When each shot area 11 is expanded in X and Y directions of the wafer 10 as shown in FIG. 6A and FIG. 6B, for example, the scaling correction value is determined based on the magnitudes of expansion in X and Y directions of each shot area 11 to correct the magnitude of expansion. Similarly, the value is determined based on the magnitude of contraction when each shot area 11 is contracted.

Figure 7A:
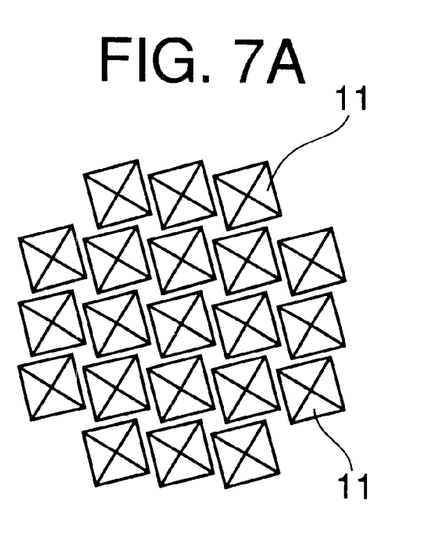
FIG. 7A is an explanatory drawing of a rotation correction value for each shot area on a semiconductor wafer of the present invention.
Figure 7B:
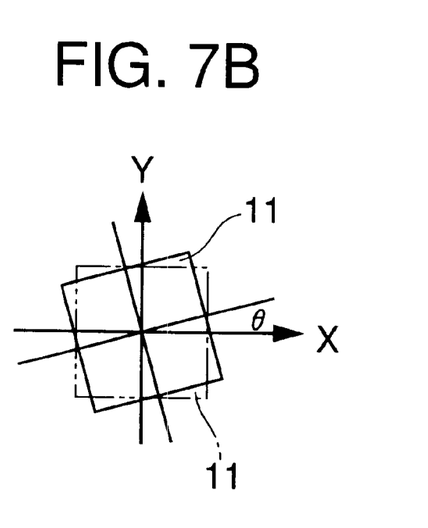
FIG. 7B is a macrograph of a shot area in FIG. 7A.

When each shot area 11 on the wafer 10 is rotated by an angle θ as shown in FIG. 7A and FIG. 7B, the rotation correction value of each shot area 11 is determined based on the angle θ of rotation of each shot area 11 to correct the rotation.

When each correction value is determined in this way, the coordinates (designed value preset) of each shot area with reference to the wafer stage WS is corrected by the main controller 38 based on each correction value and the corrected coordinates are stored in the memory of the main controller 38.

When the coordinates of each shot area with reference to the wafer stage WS are determined in this way, the warpage correction value of the wafer 10 is then calculated. The warpage correction value of the wafer 10 is determined, when the wafer 10 is warped, by measuring the magnitude of warpage to correct the step pitch for moving the shot areas 11 to the exposure position based on the measured amount of warpage.

Figure 8:
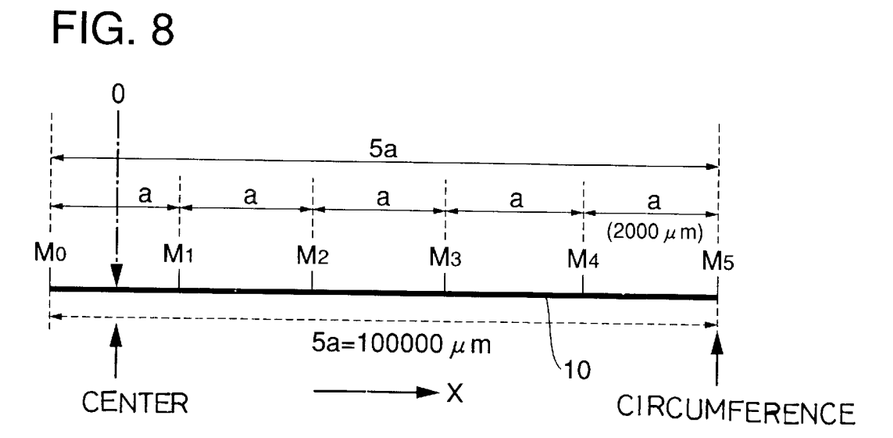
FIG. 8 is an explanatory drawing of a shot area on a semiconductor wafer without warpage.

The magnitude of warpage of the wafer 10 is calculated along the direction of the X-axis of the wafer 10 as shown in FIG. 8, for example. In FIG. 8, four shot areas 11 are provided along the direction of the X-axis from one shot area 11 provided at the center of the wafer 10 towards the circumference of the wafer 10. An alignment mark $M_1$ is provided on the boundary of the shot area 11 adjacent to the shot area 11 at the center of the wafer 10 and alignment marks $M_2$–$M_4$ are provided on the boundaries between neighboring shot areas 11 aligned along the direction of the X-axis. An alignment mark $M_5$ is provided outside the shot area 11 provided at an outermost part of the wafer 10. Accordingly, between this alignment mark $M_5$ and an alignment mark $M_0$ provided adjacent to the shot area 11 at the center of the wafer 10, five shot areas 11 are provided.

The designed value a for each of the spaces (i.e. pitch) between adjacent alignment marks for these six alignment marks $M_0$–$M_5$ is 20000 $\mu$m and the distance 5a between the alignment marks $M_0$ and $M_5$ in the direction of the X-axis is preset to 100000 $\mu$m as the designed value.

Figure 9:
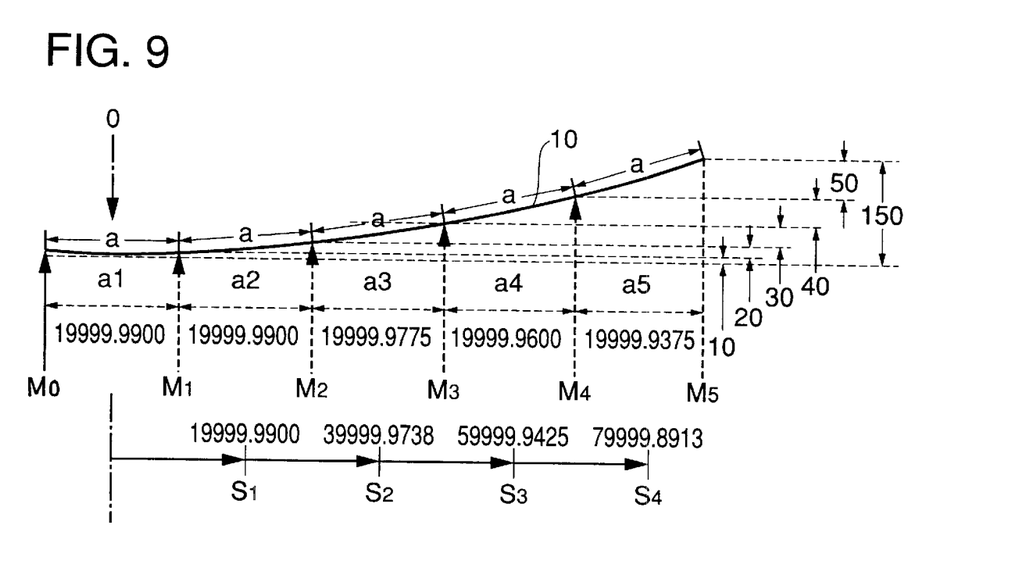
FIG. 9 is a drawing explaining the method of calculation of the magnitude of warpage in a semiconductor wafer of the present invention.

If such a wafer 10 has a warpage as shown in FIG. 9, for example, the magnitude of warpage of the alignment mark $M_5$ furthest from the center O of the wafer 10 is measured with the laser beam source 60 and a set of light-receiving elements 61. When the magnitude of warpage of the alignment mark $M_5$ with reference to the center of the wafer O is measured as 150 $\mu$m, the following calculation process takes place in the main controller 38. That is, this amount of warpage is distributed to each of the alignment marks $M_1$–$M_4$ with the angle of inclination (curvature) taken into consideration. For example, the magnitude of warpage at the alignment mark $M_1$ with reference to the center O of the wafer 10 is determined as 10 $\mu$m, the magnitude of warpage at the alignment mark $M_2$ with reference to the alignment mark $M_1$ as 20 $\mu$m, the magnitude of warpage at the alignment mark $M_3$ with reference to the alignment mark $M_2$ as 30 $\mu$m, the magnitude of warpage at the alignment mark $M_4$ with reference to the alignment mark $M_3$ as 40 $\mu$m and the magnitude of warpage at the alignment mark $M_5$ with reference to the alignment mark $M_4$ as 50 $\mu$m. The angle of inclination (curvature) is determined by using a function experimentally obtained in advance from the size and material of the wafer.

When the magnitudes of warpage at alignment marks $M_1$–$M_5$ are determined in this way, the distances $a_1$–$a_5$ between adjacent alignment marks along the direction of the X-axis are calculated. That is, the length of the base of a right triangle which has the distance a (=20000 $\mu$m) between adjacent alignment marks on the surface of the wafer 10 as the hypotenuse and the magnitude of warpage between two adjacent alignment marks as the height is calculated as the distance between two adjacent alignment marks along with the direction of the X-axis by using the Pythagorean theorem.

In this case, since the magnitude of warpage 10 $\mu$m for the alignment mark $M_1$ close to the center of the wafer 10 is determined with reference to the center O of the wafer 10, the distance $a_1$ between alignment mark $M_0$ and alignment mark $M_1$ along the direction of the X-axis is determined by doubling the distance between the center O of the wafer 10 and the alignment mark $M_1$ along the direction of the X-axis.

In this way, lengths 19999.9900 $\mu$m as distance $a_1$, 19999.9900 $\mu$m as distance $a_2$, 19999.9775 $\mu$m as distance $a_3$, 19999.9600 $\mu$m as distance $a_4$, 19999.9375 $\mu$m as distance $a_5$, are determined.

When the distances $a_1$–$a_5$ between adjacent alignment marks along the direction of the X-axis are determined, as shown in FIG. 9, the distances between the shot centers (S1, $S_2$, $S_3$, and $S_4$, from the center O of the wafer 10), which are the intermediate points of the distances $a_1$–$a_5$ along the direction of the X-axis, and the center O of the wafer are calculated. The results of the calculation are 19999.9900 $\mu$m, 39999.9738 $\mu$m, 59999.9425 $\mu$m and 79999.8913 $\mu$m respectively. Based on the distances between the center O of the wafer 10 and the shot centers $S_1$–$S_4$, the distance between adjacent shot centers are stored in the memory of the main controller 38 as the step pitches for moving each shot area 11 to the exposure position.

When the distances between the shot centers of the adjacent shot areas 11 are calculated as the step pitches, the wafer stage WS is moved by each step pitch in turn at the time of exposure of the shot areas 11 for positioning each shot area 11 with reference to the exposure position. Accordingly, the coordinates of shot centers $S_1$–$S_4$ can be determined without actual measurement, which reduces the man-hour for positioning.

When each shot center is given by the scaling correction in the previous process based on the distance between the center O of the wafer and alignment mark $M_5$, each shot center given by the scaling correction is compared with each shot center corrected based on the magnitude of warpage in this process and the shot center is corrected by a difference between them.

The present invention makes it possible to correct the step pitches for positioning each shot area to the exposure position based on the magnitude of warpage of a semiconductor wafer and allows the positioning of each shot area with reference to the exposure position without reducing the throughput and with high accuracy.

What is claimed is:

1. A method of positioning a semiconductor wafer, the method comprising:

fixing a semiconductor wafer on a wafer stage, the semiconductor wafer including a plurality of shot areas regularly arranged thereon, and positioning each of the shot areas in turn in an exposure position by a step and repeat system, determining warpage of the semiconductor wafer using a plurality of linearly arranged alignment marks, wherein a first of the plurality of alignment marks is on a boundary of the shot area at the center of the semiconductor wafer and a last of the plurality of alignment marks is provided outside a shot area provided at the periphery of the semiconductor wafer and is the alignment mark of the plurality furthest from the center of the wafer, and total warpage magnitude is determined for the last alignment mark relative to a central area of the wafer; and distributing the total warpage determined to the plurality of linearly arranged alignment marks in a manner so that warpage magnitude between pairs of adjacent alignment marks progressively increases moving away from the center of the wafer so that warpage magnitude distributed between second and third adjacent alignment marks of the plurality is less than warpage magnitude distributed between the third and a fourth alignment mark of the plurality, where the second, third and fourth alignment marks are located progressively further from the center of the wafer;

wherein a step pitch to move each of the shot areas to the exposure position is adjusted by a magnitude of warpage of the semiconductor wafer.

2. The method of claim 1 wherein at least one alignment mark is provided for each shot area on the semiconductor wafer.

3. The method of claim 2 wherein the magnitude of warpage of the semiconductor wafer is measured after the semiconductor wafer is positioned on the wafer stage.

4. The method of claim 2 wherein the step pitch is adjusted by a difference in magnitude of warpage between adjacent alignment marks.

5. The method of claim 1 wherein the magnitude of warpage of the semiconductor wafer is determined by measuring a difference in height between a central portion and a peripheral portion of the semiconductor wafer.

6. The method of claim 1 wherein the step pitch is adjusted based on a displacement of a center of the shot area, the displacement being calculated from the magnitude of warpage.

7. A method of positioning a semiconductor wafer, the method comprising:

fixing the semiconductor wafer on a horizontal wafer stage, the semiconductor wafer including a plurality of shot areas regularly arranged thereon, positioning each of the shot areas in turn in an exposure position by a step and repeat system, determining warpage of the semiconductor wafer using a plurality of linearly arranged alignment marks, wherein a first of the plurality of alignment marks is on a boundary of the shot area at the center of the semiconductor wafer and a last of the plurality of alignment marks is provided outside a shot area provided at the periphery of the semiconductor wafer and is the alignment mark of the plurality furthest from the center of the wafer, and total warpage magnitude is determined for the last alignment mark relative to a central area of the wafer, distributing the total warpage magnitude to the plurality of alignment marks based on a curve bridged between the center of the wafer and the last of the plurality of alignment marks, the curve being predetermined by a size and material of the wafer, and calculating horizontal distances between pairs of adjacent alignment marks from the distributed warpage magnitude, wherein a step pitch to move each of the shot areas to the exposure position is adjusted based on each calculated distance.

\* \* \* \* \*